United States Patent [19]

Ueno

[11] Patent Number: 5,319,221

[45] Date of Patent: Jun. 7, 1994

[54] SEMICONDUCTOR DEVICE WITH MISFET-CONTROLLED THYRISTOR

[75] Inventor: Katsunori Ueno, Kawasaki, Japan

[73] Assignee: Fuji Electric Co., Ltd., Kawasaki, Japan

[21] Appl. No.: 944,220

[22] Filed: Sep. 14, 1992

[30] Foreign Application Priority Data

Sep. 24, 1991 [JP] Japan .................. 3-243429

[51] Int. Cl.[5] .................. H01L 29/74; H01L 31/111; H01L 29/76
[52] U.S. Cl. .................. 257/135; 257/132; 257/133; 257/168; 257/365
[58] Field of Search .............. 257/107, 110, 132, 133, 257/135, 140, 146, 168, 139, 138, 365

[56] References Cited

U.S. PATENT DOCUMENTS 5,194,927  3/1993  Ueno .................. 257/365

OTHER PUBLICATIONS

Proceedings of the 3rd International Symposium on Power Semiconductor Devices and ICs (1991) (pp. 128–131), Shekar et al., "Experimental Demonstration of the Emitter Switched Thyristor".

Proceedings of the 3rd International Symposium on Power Semiconductor Devices and ICs (pp. 132–137), Sumida et al., "Numerical Analysis of Switching in the IGBT Triggered Thyristor".

*Primary Examiner*—Rolf Hille
*Assistant Examiner*—Steven Loke
*Attorney, Agent, or Firm*—Kanesaka & Takeuchi

[57] ABSTRACT

MOS-controlled thyristor is formed of a P-type first base layer (23), an N-type floating emitter layer (24), and a P-type second base layer (25) on an N$^-$-type base layer (14), by a double diffusion process. The thyristor mode is realized early on and conduction in a parasitic thyristor is prevented by forming a source layer (17) in the second base layer (25) to restrict the current flowing through the second base layer (25). The semiconductor has high withstand voltage, low resistance over the entire device, suppresses the occurrence of discontinuity in the voltage-current curve, and is capable of suppressing the latch-up phenomenon and controlling large currents.

11 Claims, 5 Drawing Sheets

SEMICONDUCTOR DEVICE WITH MISFET-CONTROLLED THYRISTOR

BACKGROUND OF THE INVENTION AND RELATED ART STATEMENT

The present invention relates to a semiconductor device equipped with a MISFET-controlled thyristor consuming less power in a gate circuit and exhibiting excellent switching characteristics. This is a power semiconductor device capable of controlling large currents under a high withstand voltage.

A power semiconductor that can control large currents under a high withstand voltage must have a low potential drop or a low on-state voltage under a current conduction, and furthermore, must be capable of turning a current on and off rapidly, that is, high-speed switching. To meet these requirements, an insulting gate bipolar transistor (IGBT) with lower on-state voltage than a power MOSFET, and capable of higher speed switching than a bipolar transistor must be developed. Furthermore, it is also necessary to develop a semiconductor device which can control a thyristor using a MOS gate with low on-sate voltage.

FIG. 5 shows a cross section of a MOS-controlled thyristor element capable of suppressing power consumption in a gate current when turned off, as well as high-speed switching. This element is called an emitter-switched thyristor (hereinafter EST).

FIG. 5 shows a vertical-type thyristor element, which uses a substrate (10) made of a thin silicon sheet consisting of a p+-type anode layer (12) disposed on a metallic anode electrode (11), an N-type guard layer (13) laminated on the anode layer (12), and an N⁻-type base layer (14) laminated on the N-type guard layer (13). On the surface of the N⁻-type base layer (14) on the substrate (10), a P-type base layer (15) is formed, and on the surface of the P-type base layer (15), an N+-type source layer (17) and a floating emitter layer (16) are formed. Furthermore, a polysilicon layer to be used as a first gate electrode (21) and a second gate electrode (22) is formed via a gate-insulating film (18). The source layer (17) and the floating emitter layer (16) are shallower than the P-type base layer (15), and an N-channel type first MOS (35) is made up of a first gate electrode (21), the source layer (17) and the floating emitter (16). An N-channel second MOS (36) is made up of the second gate electrode (22), the floating emitter layer (16) and the N⁻-type base layer (14). Numerals (35') and (36') show channel regions of the first and second MOS (35) and (36), respectively. These gate electrodes (21, 22) are driven by the same gate potential. The source layer (17) is made to contact with the emitter electrode (19) so that it short-circuited with the P-type base layer (15). Many thyristor elements are constructed on the surface of the semiconductor device by such first and second MOS (35 and 36), and the emitter electrode (19).

In the above element, an NPN-type transistor (31) is formed by the N+-type floating emitter layer (16), the P-type base layer (15), the N⁻-type base layer (14) and the N-type guard layer (13). In addition, a PNP-type transistor (32) is formed by the P-type base layer (15), the N⁻-type base layer (14), the N-type guard layer (13) and the P+-type anode layer (12). In other words, the thyristor element is constructed by the N+-type floating emitter layer (16), the P-type base layer (15), the N⁻-type base layer (14), the N-type guard layer (13) and the P+-type anode layer (12).

In this element, the first and second MOS (35, 36) are turned on when a positive potential is applied to the gate electrodes (21, 22). As a result, a current flows into the base of the PNP-type transistor (32), thus the entire element is conducted. The PNP-type transistor is now in the same condition as the IGBT. As the base short circuit current that flows from the emitter electrode (19) into the base layer (15) increases, the base potential at the NPN transistor (31) rises by a base short circuit resistance (39) to this current. Therefore, this NPN transistor (31) is also conducted, as does the thyristor consisting of the transistors (31, 32). The base short circuit resistance (39) works as a result of the P-type base layer (15), and the current flowing in the base layer (15) raises the potential at the base layer (15) directly below the emitter layer (16), and conducts the NPN transistor (31).

FIG. 7 shows the voltage-current characteristics of this element. As described above, this element moves to a thyristor mode (52) through an IGBT mode (51). A sharp decrease in the resistance that occurs during the transference from the IGBT mode (51) to the thyristor mode (52) causes the voltage to decrease, thereby resulting in a discontinuity point (53).

To turn this element off, it is sufficient to apply a zero or negative potential to the gate electrodes (21, 22). This application turns the MOS (35, 36) off, while the emitter layer (16) is insulated from the emitter electrode (19), and the element is turned off. Thus, the emitter layer (16) is switched by the MOS (35), thereby enabling high-speed switching. The N⁻-type base layer (14) is used to suppress the on-state voltage, and N-type guard layer (13) is used to suppress the spread of the depletion layer and raise the withstand potential.

Because of the capability of such a MOS controlled thyristor element, which is low in the on-state voltage and is capable of high-speed switching, it has drawn attention as a power semiconductor. However, there are problems to be solved for this element, such as how to decrease the resistance in the first MOS (35), how to reduce the element resistance, how to obtain continuous voltage-current curve, how to reduce an on-state resistance by providing the thyristor operation at an early stage, and how to prevent a latch-up phenomenon caused by parasitic thyristors to raise the controllable current values.

First, for the first MOS which performs a switching operation for the floating emitter layer, since the first MOS is connected to the thyristor in series, there is a problem that the resistance of the entire element can not be reduced unless the resistance in the first MOS is reduced even if the resistance on the thyristor side is decreased. To reduce the resistance in the first MOS, it is necessary to shorten the channel length of the MOS, and furthermore micro-processing must be performed on the impurity layer that is a part of the MOS, and on the polysilicon layer which constitutes a gate electrode. Unfortunately, reducing the channel length aggravates the element characteristics because it leads to a decreased source-drain withstand voltage in the MOS.

In the conventional MOS-controlled thyristor as described above, discontinuity point in the current-voltage curve occurs during the transfer from the IGBT mode to the thyristor mode. If a circuit is constructed using this element, it may generate a trouble such as noise that is attributable to the occurrence of this discontinuity.

Furthermore, in a conventional MOS-controlled thyristor, because the P-type base layer is connected to the emitter electrode, a current flows from the base layer to the emitter electrode. Therefore, the injection of electrons from the emitter layer is suppressed, thereby making it difficult to realize the thyristor mode at an early stage. Therefore, reducing on-state resistance is difficult.

In this MOS-controlled thyristor, an NPN-type transistor (33) is parasitic as indicated by the broken lines in FIG. 6, as a result of the N+-type source layer (17), the P-type base layer (15), the N--type base layer (14) and the N-type guard layer (13). Therefore, when the current is increased and this parasitic transistor (33) is turned on, a latch-up condition is caused wherein the thyristor formed by the transistors (33, 32) is conducted, and current control becomes impossible. For this reason, the upper limit of a current that can be controlled by this element is limited to a range in which no latch-up condition occurs. Particularly, because the potential in the P-type base layer directly below the emitter layer has been high when the conventional MOS-controlled thyristor is turned on, concentrations of the minority carriers are high. Moreover, since the minority carriers are concentrated on the base layer directly below the source layer, the latch-up is liable to occur.

Therefore, in the light of the above problems, the present invention is intended to provide, by using a laminated floating emitter layer and a base layer, a semiconductor device that has a thyristor with a low-resistance, a high-withstand voltage, continuous voltage-current characteristics and a high upper limit of controllable currents.

SUMMARY OF THE INVENTION

In order to solve the above problems, in the present invention, a base region of a first conduction type is divided into two regions of a first base region and a second base region, these base regions being sequentially laminated with emitter regions of a second conduction type by using a double diffusion process. In other words, the semiconductor device with MISFET-controlled thyristors according to the present invention is formed of; a first base region of the first conduction type, an emitter region of the second conduction type, and a second base region of the first conduction type laminated in that order by using a double diffusion method, which are formed at a position opposite to an anode region of the first conduction type connected to an anode electrode, on a base region of the second conduction type; a source region of the second conduction type connected to an emitter electrode formed in the second base region of the second conduction type; a first MISFET to connect this source region of the second conduction type to the emitter region of the second conduction type; and a second MISFET to connect this emitter region of the second conduction type to the base region of the second conduction type.

It is effective that this semiconductor device has, in addition to the above first and second MISFETs, a short-circuiting MISFET that is formed to short circuit the first base region with the second base region, by disposing a gate electrode via a gate-insulation film from the source region of the second conduction type through the emitter region of the second conduction type and the first base region of the first conduction type to the base region of the second conduction type.

That is, in the semiconductor device with a MISFET-controlled thyristor of the invention the thyristor is formed of the emitter region of the second conduction type, the first base region of the first conduction type, the base region of the second conduction type, and the anode region of the first conduction type, the emitter region of the second conduction type being connected to the source region of the second conduction type connected to the emitter electrode through the first MISFET. In the present invention, it is desirable that the device has a short-circuiting MISFET which can short-circuit, when the thyristor is turned off, between the first base region of the first conductive type and the second base layer of the first conduction type connected to the emitter electrode and formed between the source region and the emitter region of the second conduction type, the second base layer constituting the first MISFET.

In such a semiconductor device equipped with a MISFET-controlled thyristor, it is effective to separate the first base region and the second base region of the first conduction type with the emitter region of the second conduction type. Furthermore, the first base region and the second base region of the first conduction type thus separated may be divided by the emitter region of the second conduction type so that they are completely independent, or they may be connected in part.

Because the base region of the first conduction type is thus divided into two regions of the first base region and the second base region, and these base regions are laminated sequentially with the emitter region of the second conduction type, which is a floating emitter region, so that the channel lengths of the first and second MISFETs are determined by diffusion. Therefore, the MISFETs are formed with short and highly accurate channel lengths without being limited in terms of photo-etching accuracy, while the resistance in the first MISFET linked in series with a thyristor is reduced. Accordingly, reduced resistance is realized in the semiconductor device according to the present invention.

Furthermore, by laminating each region using a double diffusion process, regions with reduced concentration of the impurities are formed in the boundaries between the respective regions. Therefore, an electric field when the MISFET is turned off is dispersed over these low concentration regions. Hence, the electric field concentration is relaxed, and the voltage withstand performance can be improved.

In addition, by dividing the base region of the first conduction type into a first base region and a second base region, and laminating them in the order of the first base region, the emitter region, and the second base region, the first base region constituting the base region of the first conduction type in the thyristor semiconductor device is not connected directly to the emitter electrode. Therefore, as the current flowing into the emitter electrode from the base region of the first conduction type in the thyristor is reduced, a thyristor mode in an early stage is made.

Furthermore, because the emitter region of the second conduction type is formed between the second base region of the first conduction type connected to the emitter electrode and the first base region that constitutes the thyristor, the current needed to conduct a parasitic thyristor constructed by the second base region is reduced. Therefore, the semiconductor device according to the present invention suppresses the latch-up generation, and can increase the carrying capacity of the current that can be controlled.

In addition, because the Hall current swept out into the first base region can be absorbed into the second base region via short circuiting the first base region of the first conduction type with the second base region using a short-circuiting MISFET when the semiconductor device is shut down, the emitter region is separated quickly. Therefore, the off-characteristics of the semiconductor devices are improved, and the tail current is reduced. In the semiconductor device according to the present invention, the short-circuiting MISFET including the first and second MISFETs can be formed easily by disposing the gate electrode via the gate-insulating film from the source region of the second conduction type through the second base region of the first conduction type, using the double diffusion process, the emitter region of the second conduction type, and the first base region of the first conduction type laminated by the double diffusion process, to the base region of the second conduction type.

In such a semiconductor device, in case the first base region of the first conduction type and the second base region of the first conduction type are divided by the emitter region of the second conduction type and made independent, the device is conducted in an early stage via the thyristors. Hence, continuous voltage-current characteristics can be obtained, and latch-up generation can be suppressed. If the separated first base region of the first conduction type is connected in part with the second base region of the first conduction type, a discontinuous point occurs in the voltage-current curve. However, since a large short circuit current is assured from the first base region to the second base region when the device is turned off, high-speed switching is possible.

DETAILED DESCRIPTION OF PREFERRED EMBODIMENTS

Embodiments of the present invention are explained with reference to the drawings.

Figure 1:
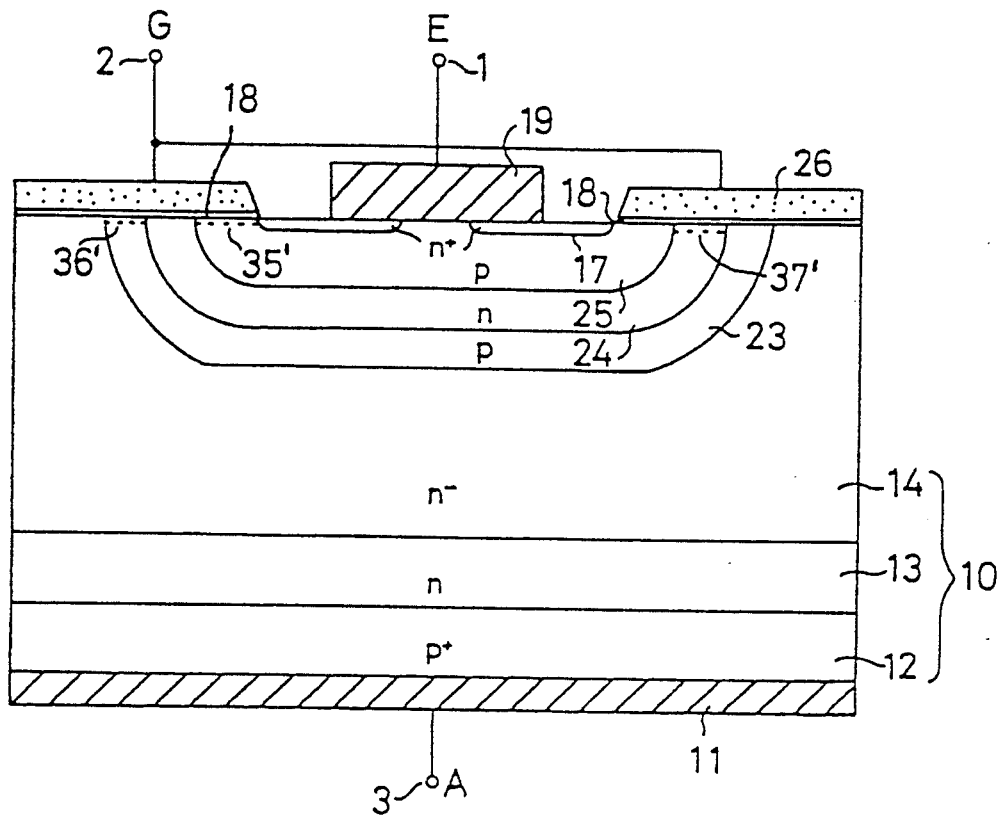
FIG. 1 is a cross section showing the construction of a MOS-controlled thyristor element according to the first embodiment.

FIG. 1 shows a cross section of the MOS-controlled thyristor element according to the first embodiment. The thyristor in this embodiment is also a vertical thyristor element similar to the conventional elements, whereas a thin silicon sheet (10), which consists of a P+-type anode layer (12) disposed on the metallic anode electrode (11), an N-type guard layer (13) laminated on this anode layer (12), and an N−-type base layer (14) laminated on this N-type guard layer (13), is used. A deep P-type first base layer (23) is formed on the surface of the N−-type base layer (14) of the substrate (10) by using a double diffusion process. On the inner side of this P-type first base layer (23), an emitter layer (24), which is an N-type floating emitter, and a P-type second base layer (25) are laminated in that order by the double diffusion process, whereas the first base layer (23) is divided from the second base layer (25) by the emitter layer (24). These three layers (23, 24, 25) are formed in a sandwich construction with a cross section like a U-shape so that the edges of the layers reach the surface of the substrate.

Furthermore, on the surface of the P-type second base layer (25) laminated in the innermost layer, two N+-type source layers (17) are formed, and the emitter electrode (19) is disposed to extend these two source layers. This emitter electrode (19) is connected to the source layers (17) and the second base layer (25) between the source layers (17). In addition, a polysilicon gate electrode (26) is disposed around the emitter electrode (19) via the gate oxide film (18). The gate electrode (26) is disposed from the edge of the source layer (17), over the second base (25), the emitter layer (24) and the first base layer (23) to the N−-type base layer (14). Therefore, when a positive potential is applied to this gate electrode (26), the source layer (17), the second base layer (25) and the emitter layer (24) constitute a first N-channel type MOS (35), and the emitter layer (24), the first base layer (23), and the N−-type base layer (14) constitute a second N-channel type MOS (36). When a negative potential is applied to the gate electrode (26), the second base layer (25), the emitter layer (24) and the first base layer (23) constitute a P-channel type MOS (37). Numerals (35'), (36') and (37') show channel regions of the MOS (35), (36) and (37), respectively. Because the layers constituting these MOS (35, 36, and 37), that is, the second base layer (25), emitter layer (24) and the first base layer (23), are laminated via the double-diffusion process as described above, the channel length of each MOS is determined by the degree of diffusion. Therefore, as the length is not affected by photo-etching accuracy, ultrafine processing is possible, and the channel length can be shortened easily and very accurately, thereby enabling the reduction of resistance in the MOS.

Furthermore, the use of the diffusion process allows the regions formed in the boundary between the layers (23, 24, and 25) to be low in impurity concentrations. This makes it possible to form the MOS with high withstand voltage, as the electric field, which tends to concentrate on the layer edges, is dispersed when the MOS (35, 36, and 37) is turned off. Therefore, it is possible to improve the voltage withstand performance of the element.

Figure 2:
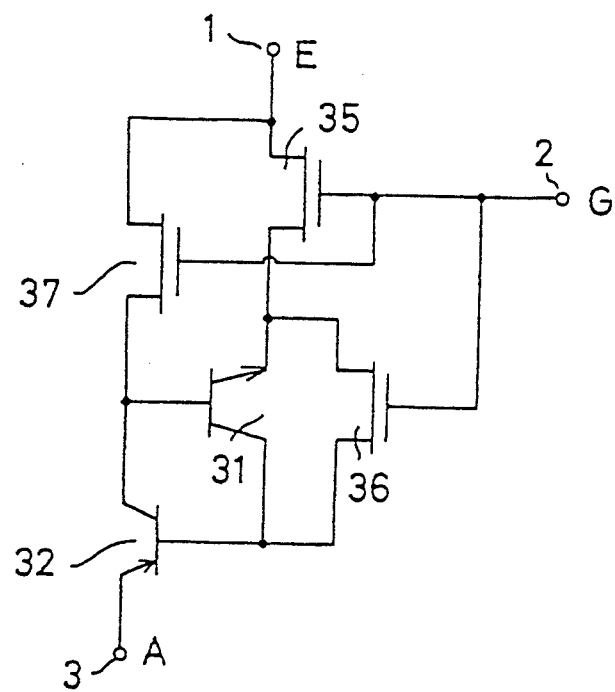
FIG. 2 is a circuit diagram showing the element shown in FIG. 1.

FIG. 2 shows a circuit diagram relating to the present element. The element of this embodiment has, as in the case of the conventional elements described above, an NPN-type transistor (31) constructed by an N-type floating emitter layer (24), the P-type first base layer (23), the N−-type base layer (14) and the N-type guard layer (13), and a PNP-type transistor (32) constructed by the P-type first base layer (23), the N−-type base layer (14), the N-type guard layer (13) and the P+-type anode layer (12). In other words, a thyristor is constructed by the N-type floating emitter layer (24), the P-type first base layer (23), the N−-type base layer (14), the N-type guard layer (13) and the P+-type anode layer (12).

Figure 7:
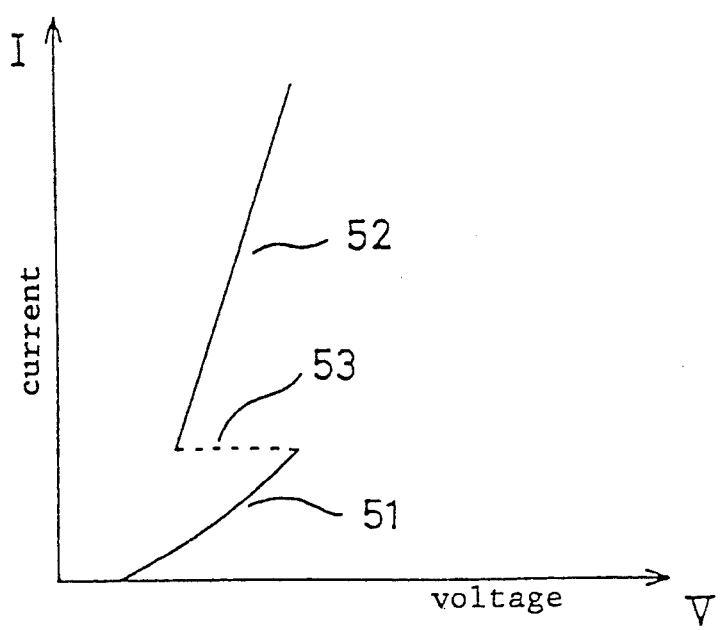
FIG. 7 is a graph showing the voltage-current characteristics of the element shown in FIG. 6.

With this element, when a positive potential is applied to the gate electrode (26), the first and the second MOS (35 and 36) are turned on. As a result, electrons are injected into the N−-type base layer (14) from the N+-type source layer (17) via the emitter layer (24), and in response to this injection, holes are injected into the N−-type base layer (14) from the P+-type anode layer (12). The holes that reach the first base layer (23) are then injected into the emitter layer (24), and they are recombined with electrons, thus conducting the thyristor. Under this condition, the electrons are injected not only from the surface channel of MOS (36), but also directly from the bonded surface between the emitter layer (24) and the first base layer (23), which makes the resistance at the time of conduction very low. This condition is analogous to the condition of a conventional EST, and has been analyzed in detail in the thesis presented by the present inventors (the Number Analysis of Switching in the IGBT Triggered Thyristor presented as the Proceedings of the 3rd International Symposium on Power Semiconductors and ICs). Thus, in the element of this embodiment, the first base layer (23) does not make contact with the emitter electrode (19). Hence, there is no current directly flowing into the emitter electrode (19) from the first base layer (23), so that the thyristor is conducted at an initial stage. Therefore, there is no discontinuity in the voltage-current characteristics during a transfer from the IGBT mode to the thyristor mode as shown in FIG. 7, which makes it possible to prepare an element with continuous voltage-current characteristics. Furthermore, because the thyristor is conducted at the initial stage, the on-state resistance can be reduced.

In addition, in a conventional EST, since the P-type base layer is commonly used as a layer constituting a thyristor and as a channel layer constituting the first MOS (35), a thyristor linked to the emitter electrode (19) via this P-type base layer acts as a parasite, thereby requiring a consideration to be given concerning the occurrence of latch-up phenomenon in which this parasitic thyristor is conducted by the current flowing in this base layer. However, in the element of this embodiment, this base layer is divided by the emitter layer (24) into the first and second base layers (23, 25). Therefore, the parasitic thyristor by the first base layer (23) is formed inside the emitter layer (24), whereas no current that triggers this parasitic thyristor flows practically into the first base layer (23). For this reason, latch-up can be suppressed, thereby enabling a great increase in the controlled current by the element of this embodiment.

To turn off the element described in this embodiment, the voltage applied to the gate electrode (26) may be made negative. When a negative potential is applied to the gate electrode (26), the first and second MOS (35, 36) are turned off, with the connection between the emitter layer (24) and the emitter electrode (19) isolated, thus turning off the element. Furthermore, as the P-channel type short circuiting MOS (37) is turned on, the first base layer (23) and the second base layer (25) are short circuited, and the hole current which has been injected from the first base layer (23) into the emitter layer (24) is discharged from the emitter electrode (19) via the second base layer (25). For this reason, the emitter layer (24) and the first base layer (23) are separated by the PN junction, which turns the thyristor off early, thereby improving the characteristics of the element of this embodiment when it is turned off. Furthermore, since the holes are not charged in the emitter layer (24), the tail current generated when this element has been turned off can be reduced.

Figure 3:
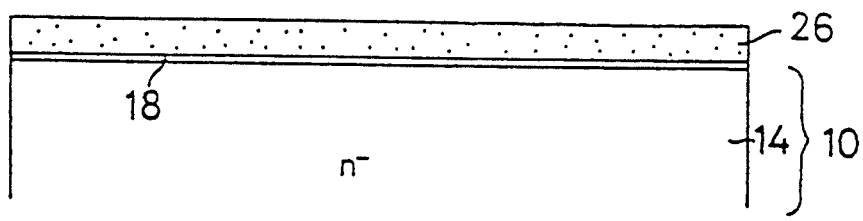
FIGS. 3(1)–(10) illustrate the method of manufacturing the element shown in FIG. 1.
Figure 3:
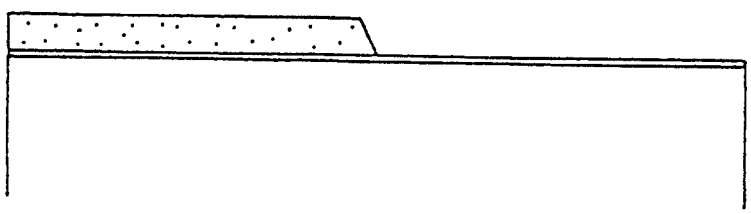
Figure 3:
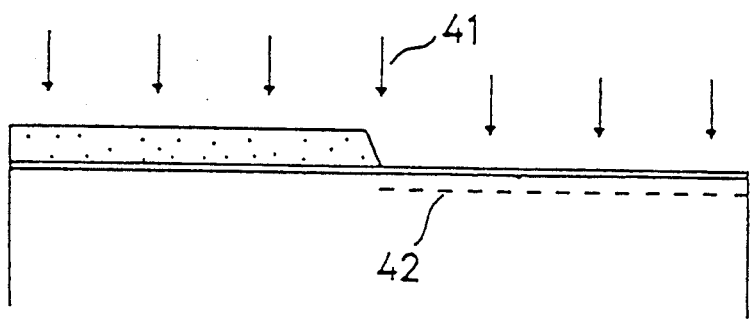
Figure 3:
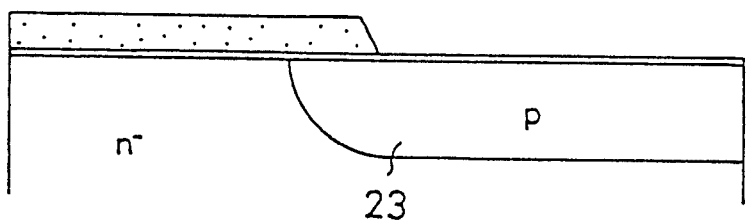
Figure 3:
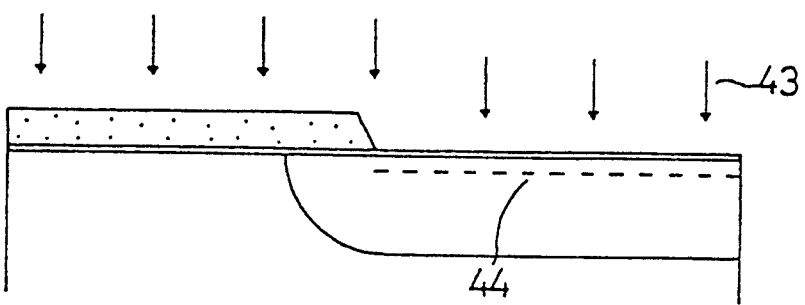
Figure 3:
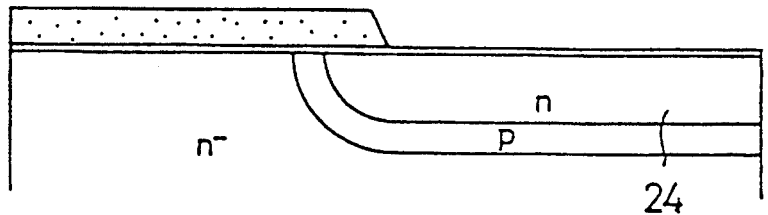
Figure 3:
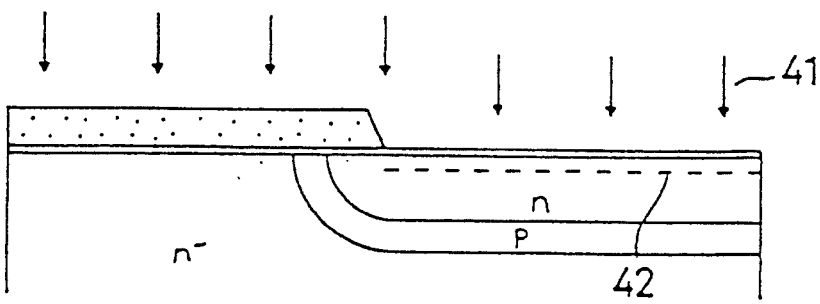
Figure 3:
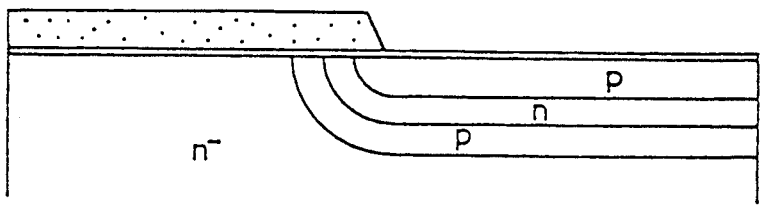
Figure 3:
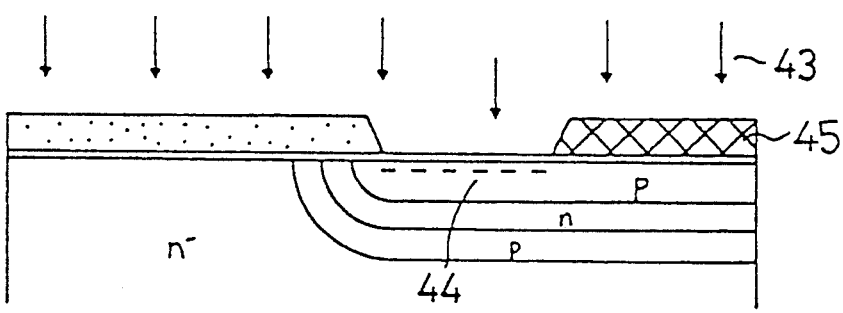
Figure 3:
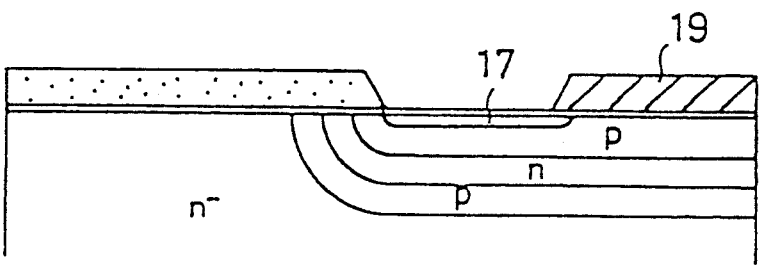

FIG. 3 illustrates one example of the method of manufacturing the element of this embodiment. First, as shown in FIG. 3(1), the gate oxide film (18) is formed on the substrate (10) which has been formed up to the N−-type base layer (14), polysilicon or other materials to form the gate electrode (26) is laminated by using CVD process, etc. Then, as shown in FIG. 3(2), this polysilicon is patterned and etched to form the gate electrode (26). Next, as shown in FIG. 3(3), P-type impurity ions (41) that form the P-type first base layer (23) are injected using the etched polysilicon as a mask, thereby forming the P-type impurity layer (42). Then, as shown in FIG. 3(4), this is diffused to form the P-type first base layer (23). Similarly in FIG. 3(5), N-type impurity ions (43) used for forming the N-type emitter layer (24) are injected to form the N-type impurity layer (44), and this layer is diffused in FIG. 3(6) to form the emitter layer (24). Furthermore, the P-type impurity ions (41) are injected onto this emitter layer (24) in FIG. 3(7) to form the P-type impurity layer (42), which is diffused in FIG. 3(8) to form the P-type second base layer (25). Next, as shown in FIG. 3(9), the N-type impurity ions (43) are injected onto the surface of the second base layer (25) using a photo-resist film (45) to form the N+-type source layer (17). Then, the emitter electrode (19) is disposed on the source layer (17) in FIG. 3(10) to complete the element.

Figure 4:
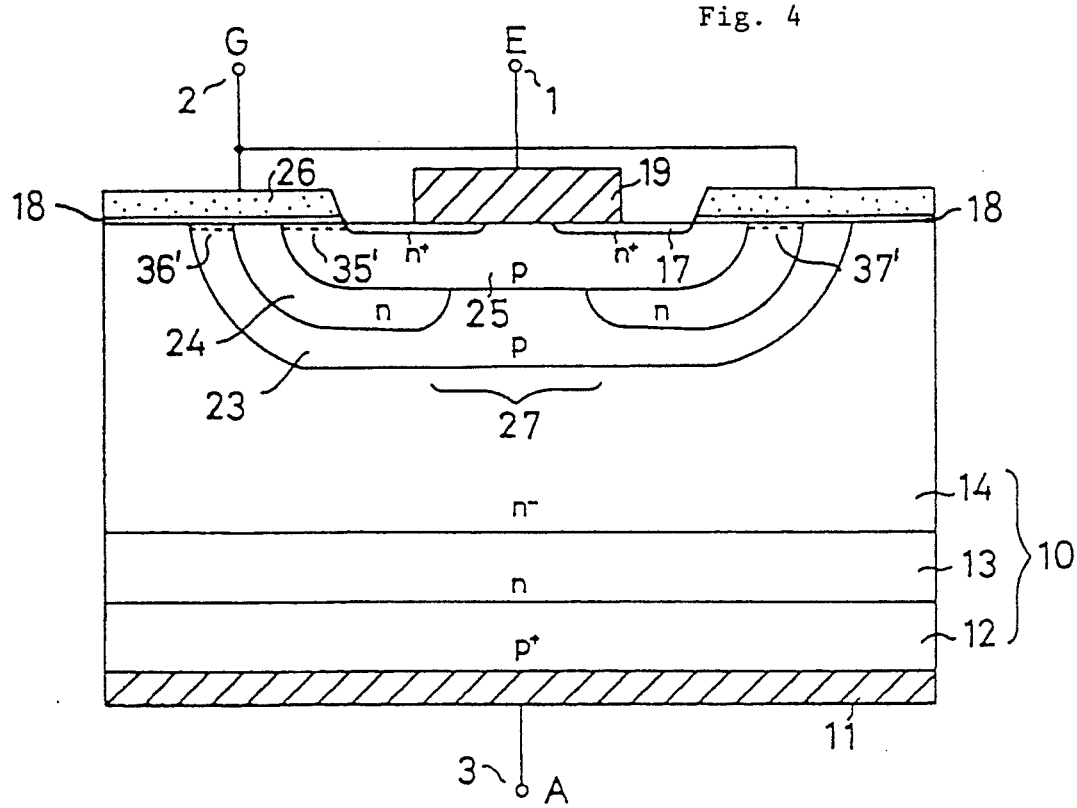
FIG. 4 is a section showing the construction of a MOS-controlled element according to the second embodiment.
Figure 5:
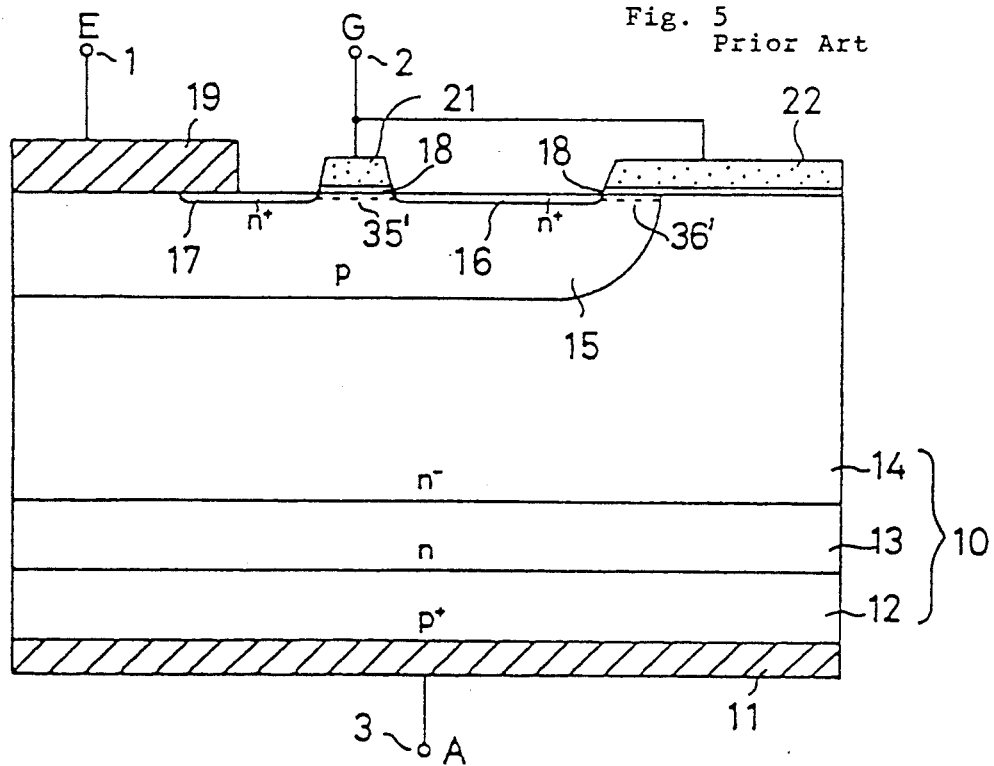
FIG. 5 is a cross section showing the construction of a conventional MOS-controlled thyristor element.
Figure 6:
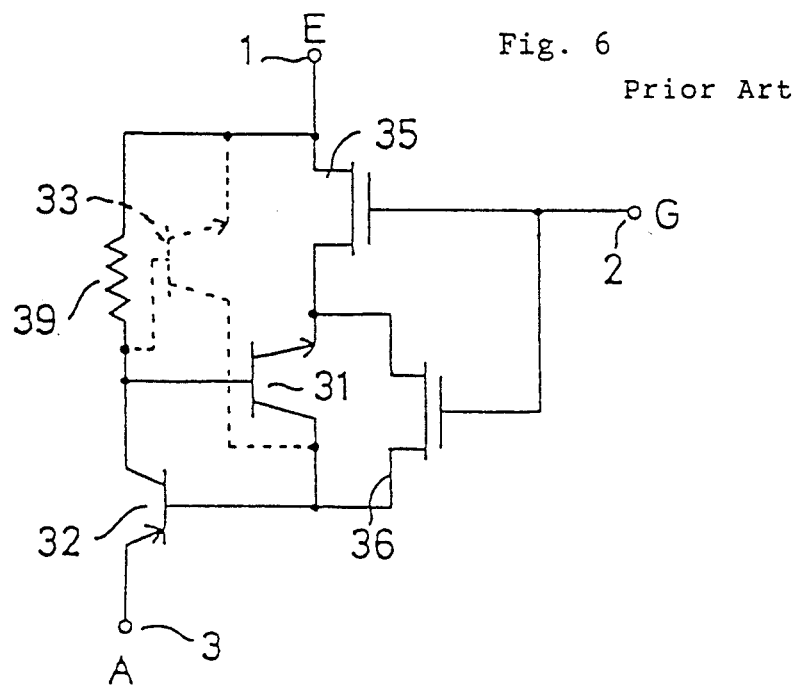
FIG. 6 is a circuit diagram of the element shown in FIG. 5.

FIG. 4 shows a cross section of a semiconductor device with an MOS-controlled thyristor according to the second embodiment. The element of this embodiment is also a vertical element, which uses, as in the first embodiment, the substrate (10) of a thin silicon sheet consisting of the P+-type anode layer (12) disposed on the metallic anode electrode (11), the N-type guard layer (13), and the N−-type base layer (14). It is identical with the first embodiment in that, on the surface of the N−-type base layer (14) on the substrate (10), the P-type first base layer (23), the N-type floating emitter layer (24), and the P-type second base layer (25) are laminated in that order via the double diffusion process, while the first MOS (35), the second MOS (36), and the P-channel type MOS (37) are formed by the silicon gate electrode (26) disposed through the gate oxide film (18). Since these constructions and the effects are the same as in the first embodiment, the same numerals are given, with explanations omitted. The operations are also the same as in the first embodiment, and explanations are therefore omitted.

It is noteworthy that in this embodiment, the first base layer (23) and the second base layer (25) separated by the emitter layer (24) are connected at a central part of the element. That is, the first base layer (23) and the second base layer (25) are short-circuited via a central connection region (27). Therefore, when the element is turned on, a current flows from the first base layer (23) into the emitter electrode (19) via the connection region (27). Hence, the element is in the IGBT mode at an early stage as in the case of conventional elements. This results in occurrence of a discontinuous point in the voltage-current curve. However, the element in this embodiment has a restricted current flowing from the first base layer (23) to the emitter electrode (19) via the second base layer (25) more than that in the conventional elements, since the area of the region (27) connecting the first base layer (23) and the second base layer (25) is limited, and the connecting face between the first base layer (23) and the emitter layer (24) is located deeper than the connecting face between the second base layer (25) and the source layer (17). Therefore, a transfer from the IGBT mode to the thyristor mode is made quickly enough, so that the discontinuity in voltage-current curve would not be so large. Since the current flowing through the second base layer (25) is small as a matter of course, the parasitic thyristor conducts less frequently, and the latch-up phenomenon is suppressed.

Furthermore, one of the features of the element in this embodiment is in its characteristics while being turned off. That is, in the element in this embodiment, the emitter layer (24) is electrically separated to improve its characteristics while being turned off, by shortening the first and second base layers (23, 25) using the MOS (37) as explained in the first embodiment. In addition to this, this embodiment enables a reduction of the short circuit resistance when the device is turned off and allows high-speed switching because the connection region (27) is formed in the first and second base layers. Thus, as a result of forming a region to connect the first and the second base layers by double diffusion, the element has lower resistance, a higher withstand voltage, smaller amount of discontinuity in the voltage-current curve, less possibility of latch-up phenomenon, and a higher speed.

In this embodiment and in the first embodiment, the vertical element, in which the anode electrode and the emitter electrode are located opposite to each other on the surface and the rear of the substrate, has been explained. It goes without saying that the element can be horizontal, in which the anode electrode and the emitter electrode are formed on the same face.

As explained above, a semiconductor with a MISFET-controlled thyristor according to the present invention has a base region of the first conduction type formed separately by the floating emitter region by means of the double diffusion process. Therefore, it is possible to make the channel length of the MISFET controlling the thyristor shorter and more stable, so that resistance in the semiconductor as a whole can be reduced, and a higher withstand voltage can be made in the MISFET.

Furthermore, it is possible to conduct at an early stage via the thyristor mode because the base region of the first conduction type is constructed so that it is separated by the emitter region, thereby suppressing discontinuity in the voltage-current curve, and reducing the on-state resistance simultaneously. In addition, since it is possible to suppress the current to trigger the parasitic thyristor, the latch-up phenomenon can be suppressed and high voltage current can be controlled. It is also possible to stop a thyristor operation early enough by forming the MISFET so that it short-circuits the separated base regions, and to perform high-speed switching using this semiconductor. Thus, in a semiconductor element with a MISFET-controlled thyristor according to the present invention, it is possible to form a power device that is low in resistance and high in withstand voltage, has excellent voltage-current characteristics, and is capable of controlling large currents and performing high-speed switching.

While the invention has been explained with reference to the specific embodiments of the invention, the explanation is illustrative and the invention is limited only by the appended claims.

What is claimed is:

1. A semiconductor device with a MISFET-controlled thyristor having an emitter electrode, an anode electrode, and a base layer attached to the anode electrode and having an anode region with a first conduction type and a base region with a second conduction type situated at a side opposite to the anode electrode, comprising:

a first base region with the first conduction type disposed on the base region of the base layer, an emitter region with the second conduction type disposed on the first base region and a second base region with the first conduction type disposed on the emitter region, said first base region, said emitter region and said second base region being laminated by a double diffusion method, a source region with the second conduction type connected to the emitter electrode and formed in the second base region, a first MISFET formed on and between the source region and the emitter region, and a second MISFET formed on and between the emitter region and the base region of the base layer.

2. A semiconductor device according to claim 1, further comprising a gate electrode and a gate insulation film disposed under the gate electrode, said gate electrode extending from the source region to the base region of the base layer through the first and second base regions and the emitter region.

3. A semiconductor device according to claim 2, wherein channel regions of said first and second MISFETs are formed on the second and first base regions, respectively.

4. A semiconductor device according to claim 2, wherein said first base region is not connected to the emitter electrode so that when a positive potential is applied to the gate electrode, the first and second MISFETs are turned on to thereby form the thyristor at an initial stage.

5. A semiconductor device according to claim 4, further comprising a short-circuiting MISFET formed on the first and second base region and the emitter region situated between the first and second base regions to quickly turn off the thyristor when a negative potential is applied to the gate electrode.

6. A semiconductor device according to claim 1, wherein said first and second base regions are separated by the emitter region.

7. A semiconductor device according to claim 1, wherein said first MISFET further includes the second base region, and said second MISFET further includes the first base region.

8. A semiconductor device with a MISFET-controlled thyristor, said thyristor including an emitter electrode, a source region with a second conduction type connected to the emitter electrode, an emitter region with a second conduction type situated under the source region, a second base region with a first conduction type situated between the source region and the emitter region, said second base region together with the source region and the emitter region forming a first MISFET thereon and connected to the emitter electrode, a first base region with the first conduction type situated under the emitter region, a base region with a second conduction type situated under the first base region, and an anode region with the first conduction type situated under the base region with the second conduction type, said thyristor being controlled by said source region and said emitter region, said device further comprising, a short-circuiting MISFET for short-circuiting between the second base region with the first conduction type and the first base region with the first conduction type when the thyristor is turned off, said short-circuiting MISFET being formed on and between the second base region and the first base region.

9. A semiconductor device according to claim 8, wherein said first and second base regions are separated by the emitter region.

10. A semiconductor device according to claim 8, wherein said first base region and the second base region are partially connected together.

11. A semiconductor device according to claim 8, wherein said short-circuiting MISFET further includes the emitter region.

* * * * *